US006894322B2

(12) United States Patent
Kwan et al.

(10) Patent No.: US 6,894,322 B2
(45) Date of Patent: May 17, 2005

(54) BACK ILLUMINATED PHOTODIODES

(75) Inventors: Steven Kwan, Belle Mead, NJ (US); Rafael Ben-Michael, Scotch Plains, NJ (US); Mark Itzler, Princeton, NJ (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/361,233

(22) Filed: Feb. 10, 2003

(65) Prior Publication Data

US 2003/0178636 A1 Sep. 25, 2003

Related U.S. Application Data

(60) Provisional application No. 60/355,880, filed on Feb. 11, 2002.

(51) Int. Cl.[7] .......................................... H01L 31/0328
(52) U.S. Cl. ...................... 257/186; 257/187; 257/188; 257/189; 257/191; 257/190; 257/438; 257/458
(58) Field of Search ............................... 257/460, 436, 257/186, 2, 461, 462, 463

(56) References Cited

U.S. PATENT DOCUMENTS

| | | | | |
|---|---|---|---|---|
| 5,010,018 A | * | 4/1991 | Polasko et al. | 438/92 |
| 5,591,407 A | * | 1/1997 | Groger et al. | 422/82.05 |
| 5,766,956 A | * | 6/1998 | Groger et al. | 436/164 |
| 6,043,550 A | * | 3/2000 | Kuhara et al. | 257/461 |
| 6,437,362 B2 | | 8/2002 | Suzuki | 257/21 |
| 6,518,638 B1 | * | 2/2003 | Kuhara et al. | 257/431 |
| 2002/0113282 A1 | * | 8/2002 | Yoneda et al. | 257/436 |
| 2003/0047752 A1 | * | 3/2003 | Campbell et al. | 257/186 |

OTHER PUBLICATIONS

Y. Kito, et al., "High–speed flip–chip InP/InGaAs avalanche photodiode with ultra low capacitance and large Gain–Bandwidth products," IEEE Photon. Tech. Lett., vol. 3, No. 12, pp. 1115–1116 (1991).

Chong–Long Ho, et al., "Effectiveness of metallic mirror for promoting the photoresponse of InGaAs PIN photodiode," Solid–State Electronics, vol. 43, pp. 961–967 (1999).

I–Hsing Tan, et al., "120–GHz long–wavelength low–capacitance photodetector with an Air–Bridged coplanar metal waveguide," IEEE Photon. Tech. Lett., vol. 7, No. 12, pp. 1477–1479 (1995).

D. Babic et al., "Design and analysis of double–fused 1.55 μm vertical—cavity lasers," IEEE J. of Quantum electronics, vol. 33, No. 8, pp. 1369–1383 (1997).

D. Babic et al., "Characterization of metal mirrors on GaAs," Electronics Lett., vol. 32, No. 4, pp. 319–320 (1996).

R. Killey et al., "Multiple–quantum–well asymmetric fabry–perot modulators for microwave photonic applications," Microwave Theory and Techniques, IEEE Transactions on, vol. 49 No. 10 Part: 2, pp. 1888–1893 (2001).

* cited by examiner

Primary Examiner—Nathan J. Flynn
Assistant Examiner—Fazli Erdem
(74) Attorney, Agent, or Firm—Allen, Dyer, Doppelt, Milbrath & Gilchrist, P.A.

(57) ABSTRACT

A highly reflecting back illuminated diode structure allows light that has not been absorbed by a semiconductor absorbing region to be back reflected for at least a second pass into the absorbing region. The diode structure in a preferred embodiment provides a highly reflecting layer of gold to be supported in part by a conducting alloyed electrode ring contact and in part by a passivation layer of $Si_xN_y$. Conveniently this structure provides a window within the contact which allows light to pass between the absorbing region and the reflecting layer of gold.

15 Claims, 5 Drawing Sheets

BACK ILLUMINATED PHOTODIODES

CROSS-REFERENCE TO RELATED APPLICATIONS

This application claims priority of U.S. Provisional Patent Application No. 60/355,880 filed on Feb. 11, 2002, entitled "Avalanche Photodiode With Improved Responsivity Utilizing A Highly Reflective Metal Contact" which is incorporated herein by reference for all purposes.

TECHNICAL FIELD

The present invention relates to photodiodes(PDs) and more particularly, to diode structures applicable to back-illuminated positive-intrinsic-negative (PIN) photodiodes and avalanche photodiodes (APDs).

BACKGROUND OF THE INVENTION

One of the major parameters that determine the performance of a photodiode is its responsivity to light. The responsivity, R, is defined as the current generated by the photodiode (PD) per unit incident light power and is typically expressed in amperes per watt (A/W). This detection property of a PD can be equivalently described by the quantum efficiency $\eta_{ext}$, which is 100% when every incident photon excites an electron-hole pair that is eventually collected by the electrodes. The relation between the responsivity and the quantum efficiency is $$R = \frac{e}{h\nu}\eta_{ext}$$

where hv is the photon energy and e is the electron charge.
$\eta$ is dictated entirely by the number of electron-hole pairs collected, whereas the responsivity is dependent on wavelength (photon energy).

The purpose of this invention is to improve the intrinsic responsivity of a photodiode such as an avalanche photodetector (APD). A standard positive-intrinsic-negative (PIN) PD is quantum-limited since, for each incoming photon, a single electron-hole pair (at most) is contributed to the total photocurrent. An APD, by virtue of its internal avalanche gain, can achieve a much higher responsivity than a PIN-PD. However, the intrinsic responsivity of the APD (i.e., at unity gain) is still critical to the device performance. In particular, the sensitivity of a fiber optic receiver utilizing an APD will improve proportionally with improvements in the intrinsic responsivity, so increasing this responsivity at unity gain as much as possible is very important.

Specifically, this invention is intended to provide a structure that increases the reflectivity of the front (top) contact region of a back-illuminated, surface-normal photodiode such as an APD. The responsivity of a surface-normal APD is determined by several factors, such as the thickness of the absorption layer, the optical loss in material other than absorption layer, and reflections from the interfaces. For absorption layers of finite width, some fraction of the incident light will pass through this layer without being absorbed and may be partially absorbed in the contact material without contributing to the photocurrent. But if the contact structure is designed so that this light is efficiently reflected back for a second pass through the absorption layer, the overall fraction of the incident light contributing to photocurrent will increase.

In the past, it has been known to provide an at least partially reflecting layer within a back illuminated photodiode so that unabsorbed light that passed through a semiconductor absorption layer could be recovered by way of being reflected back to the absorption layer for a second pass rather than being lost. As telecommunications specifications become more stringent, such light recovery schemes become particularly critical to provide devices that will meet these challenging requirements. For example, a prior art search has revealed that recently issued U.S. Pat. No. 6,437,362 in the name of Suzuki assigned to Matsushita Electric Industrial Co., Ltd. (Osaka, JP) incorporated herein by reference discloses a diode structure that at least partially addresses these concerns. Suzuki discloses the use of a distributed Bragg reflector made from III-V semiconductor material where a metallic ohmic contact is made to be the reflector itself. Although the structure taught by Suzuki seems to perform its intended function, the invention disclosed herein, provides a different structure that offers significant advantages over prior art back illuminated photodiodes.

It is preferred to provide the ohmic contact directly to the PD epitaxial layer, rather than through the Bragg reflector semiconductor layers, as this impairs the conductivity. Furthermore, the formation of a distributed Bragg reflector between the epitaxial layer and the contact adds significant complexity to the manufacturing process.

It is therefore an object of the invention to provide a photodiode that efficiently recycles light that has passed through its active light absorbing material thereby increasing its responsivity to incoming light while maintaining good ohmic contact to the epitaxial layer.

SUMMARY OF THE INVENTION

In accordance with the invention, there is provided, a photodetector comprising:

an input port at an input end face for receiving light to be detected, the input port being disposed about semiconductor layers including an absorption layer for absorbing light to be detected sandwiched between first and second light transmissive epitaxial semiconductor layers, the second light transmissive eptaxial semiconductor layer being a capping layer;

a passivation layer supported by only a portion of a surface of the second light transmissive epitaxial semiconductor capping layer, said passivation layer having an opening within for accommodating a ring of a first contact layer of alloyed material that is supported by a another portion of the surface of the second light transmissive semiconductor capping layer and at least partially alloyed therewith for providing electrical contact to the epitaxial semiconductor layers via the second light transmissive semiconductor capping layer; and, a highly reflective non-epitaxial III-V semiconductor, non-alloyed material supported in part by the first contact layer of alloyed material and supported in part by the passivation layer, said highly reflective non-epitaxial-III-V-semiconductor, non-alloyed material facing the epitaxial semiconductor layers for reflecting back light that propagated through the absorption layer for a second pass into the absorption layer; wherein a primary electrical conduction path is formed between the first contact layer of alloyed material and the epitaxial semiconductor absorption layer.

In an photodetector in accordance with the present invention having epitaxial semiconductor layers including an absorbing layer sandwiched between light transmissive layers at an input end face, a contact layer of alloyed material for providing electrical contact to the semiconductor absorbing layer and having a passivation layer disposed about the contact layer, the improvement comprising: the passivation layer supported by one of the semiconductor light transmissive layers and bound by being contained within inner walls of the contact layer, said passivation layer at least partially supporting a highly reflective non-epitaxial-III-V-semiconductor layer disposed to reflect light incident thereon that has passed through the absorbing layer, back to the absorbing layer, at least a part of the passivation layer being supported by the contact layer of alloyed material.

A further embodiment of the present invention provides a structure within a photodiode comprising:

a semiconductor absorptive active layer for receiving and absorbing input light;

a light transmissive passivating layer forming a window over the semiconductor absorptive active layer within a contact structure, the contact structure comprising:

an electrically conductive alloyed material which forms a principal electrically conducting path to the semiconductor active layer from a contact region, said alloyed material having an opening therein surrounding the light transmissive passivating layer; and, a reflector of highly reflective non-epitaxial-III-V, non-alloyed other material provided over the window and partially supported by an upper surface of the alloyed material about the window.

A still further embodiment of the present invention provides a photodiode comprising:

an input end;

an absorption semiconductor layer disposed between at least a first and a second light transmissive semiconductor layer;

a ring of alloyed material supported by and at least partially alloyed with the second light transmissive semiconductor layer for providing a highly conducting electrical path to the absorption semiconductor layer;

a passivating layer contained within the ring of alloyed material;

a highly reflective metal mirror partially contained within the ring of alloyed material supported by the passivating layer, and partially supported by the ring of alloyed material; and an electrically conductive metal layer forming a large contact pad, covering an upper surface of the highly reflective metal mirror and a remaining portion of the ring of alloyed material not covered by the mirror.

Advantageously, this invention provides a high reflection surface without adversely affecting the ohmic contact of metal to the semiconductor substrate; ohmic contact to the III-V semiconductor is achieved using an alloyed metal to bond and partially alloy with the semiconductor. Since the alloy is a poor light reflector a non alloyed material is provided in a central location which is highly reflecting.

BRIEF DESCRIPTION OF THE DRAWINGS

Exemplary embodiments of the invention will now be described in conjunction with the drawings in which.

DETAILED DESCRIPTION

Figure 1A:
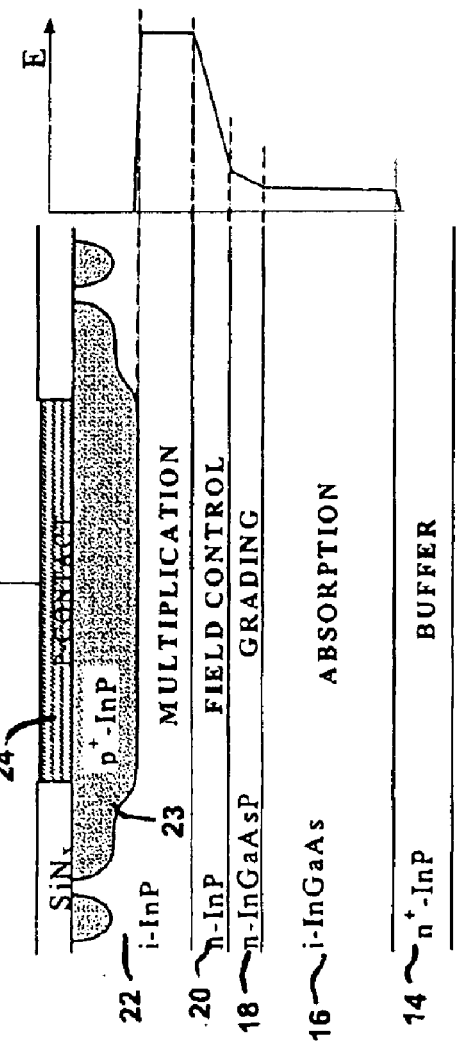
FIG. 1a is a prior art detailed drawing illustrating the layer structure of an avalanche photodiode (APD)

The layer structure of a prior art APD PC is shown schematically in detail in FIG. 1a. A terminal layer 10 adjoins an antireflection layer window 11 which defines a port 13 supported on the input end face of a substrate 12. A layer structure is created on the substrate including: a buffer layer 14, absorption layer 16, grading layer 18, field control layer 20, capping layer 22 and P dopant diffused region of the capping layer 23. Directly contacting the diffused region of the capping layer 23 is an alloyed material P-contact 24 creating some alloy mixing with the epitaxial ion infused capping layer 23. Alloyed contact material provides superior ohmic contact, however the reflectivity is inefficient. Alloyed AuZn has a reflectivity of approximately 45%.

Figure 1A:
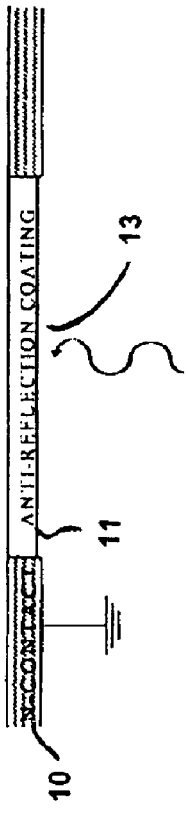
Figure 1B:
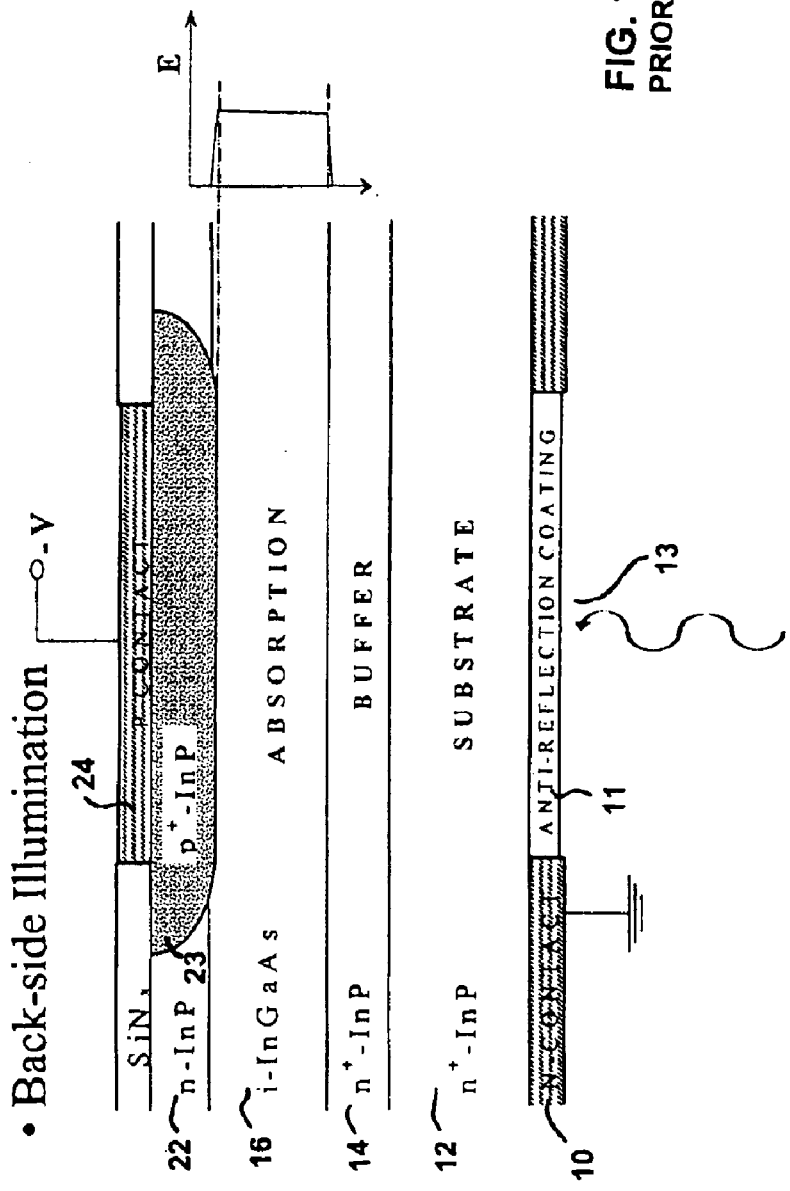
FIG. 1b is a prior art detailed drawing illustrating the layer structure of an PIN photodiode (APD.

FIG. 1b illustrates a similar schematic layer structure of a prior art PIN photodiode. The N-contact 10 and antireflection coating 11 are provided on the N side of a substrate 12. The layer structure is somewhat simpler including: a buffer layer 14, absorption layer 16, capping layer 22 and diffused region of the capping layer 23. An alloyed material P-contact is formed directly on the capping layer 23 creating some alloy mixing with the epitaxial ion infused capping layer 23.

Figure 2A:
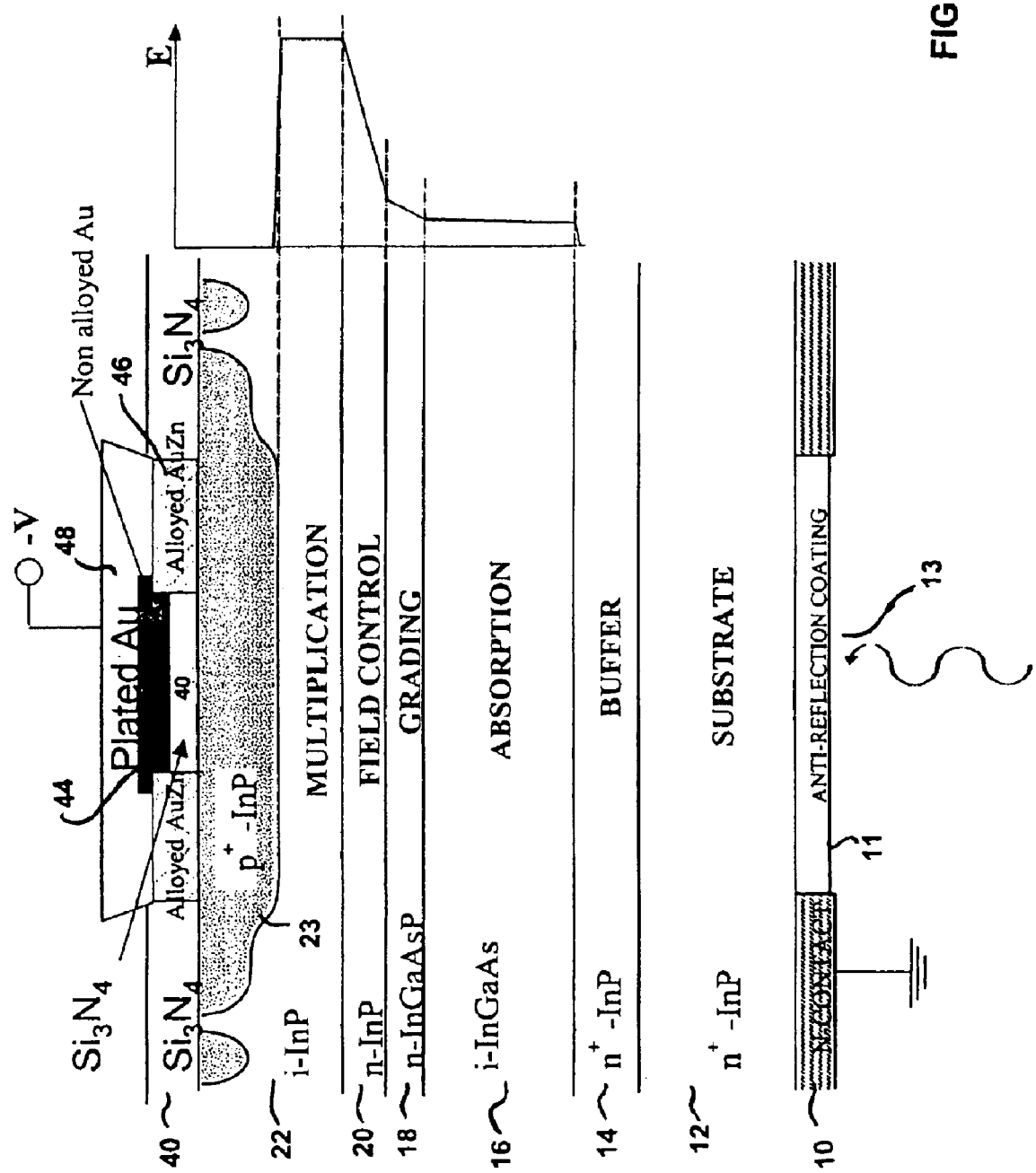
FIG. 2a is a drawing illustrating a layer structure of an APD in accordance with an embodiment of this invention.

Turning now to FIG. 2a an alternative structure of back illuminated, surface normal APD PD in accordance with an embodiment of this invention is shown which has superior performance to the device shown if FIG. 1a. The bottom layers, including the terminal layer 10, and AR coated layer 11, the substrate layer 12, buffer layer 14, absorption layer 16, grading layer 18, field control layer 20 and multiplication layer and capping layer 22/23 in FIG. 2a, are substantially the same as those shown in FIG. 1a. However, the P-contact region layer 24 in FIG. 1 has been replaced with a highly efficient contact structure which simultaneously allows a high degree of electrical conductivity, a high degree of light transmissivity though a light transmissive window 40 of $Si_xN_y$, and nearly 100% reflectivity by a gold titanium reflector 44 within an AuZn alloyed electrode ring 46. The front (or top) electrode contact ring 46 is deposited over a previously zinc diffused p-n junction. The AuZn is alloyed with the III-V material in order to provide good ohmic contact. In most practical embodiments this ring 46 is circular, however other shapes may be envisaged such as an eccentric shape. A dielectric layer of $Si_xN_y$ provides a transparent window 40 in the center of the ring 46, and prevents metal atom (Au) diffusion into the InP epitaxial layer 23. The size of window 40 is determined by the Gaussian distribution of incoming light and manufacturing capability, including parameters for metal liftoff, photolithography alignment, etc. A very thin layer of titanium for example 20 to 30 angstroms, ie less than the penetration of light at 1300 or 1550 nm, deposited by e-beam evaporation between the gold reflector 44 and the supporting window of $Si_xN_y$, and between the gold reflector 44 and the AuZn conducting path 46, promotes adhesion therebetween. The reflector 44 is preferably gold, however a highly reflecting non-eptiaxial-semiconductor, or non-alloyed material may be provided using a two material composition with high optical indices contrast such as Tantalum Pentoxide/silicon Dioxide, Titanium Dioxide/Silicon Dioxide, zirconium Dioxide/Silcon Dioxide or pure Ag, for example. The electrode ring 46 both supports the highly reflecting mirror 44 and contains the layer 40 of light transmissive $Si_xN_y$. The passivation layer 40 of $Si_xN_y$ prevents alloy mixing from occurring between the reflector material 44 and the epitaxial layer 23, improving reflectivity of the reflector 44. As apparent in FIGS. 2a and 2b, the metal reflector 44 has a larger diameter than the SiN dielectric layer 40 in order to promote adhesion to the contact 46.

An upper surface layer 48 comprising a substantially uniform highly conductive contact layer covering the reflector 44 and the contact 46, preferably of gold, provides a larger electrical contact region for a P-contact which simplifies subsequent wire bonding steps. The gold reflector layer 44 in the tested diodes is about 200 nm and serves as a seed layer for subsequent encapsulation with plated gold 48. The final gold contact will be 0.8 um to 1.5 um. The reflector layer is indistinguishable from the whole contact at the end. Conveniently the inventive structure which is relatively easily manufacturable provides the benefit of excellent reflectivity from the reflector 44 and at the same time enhanced conductivity via the AuZn path 46 which supports and partially houses the reflector 44. Trade-offs associated with poor reflectivity using an alloy for the reflector as seen in the prior art are obviated by the structure provided by this invention. As a result, the responsivity is improved and the bias voltage is reduced.

Figure 2B:
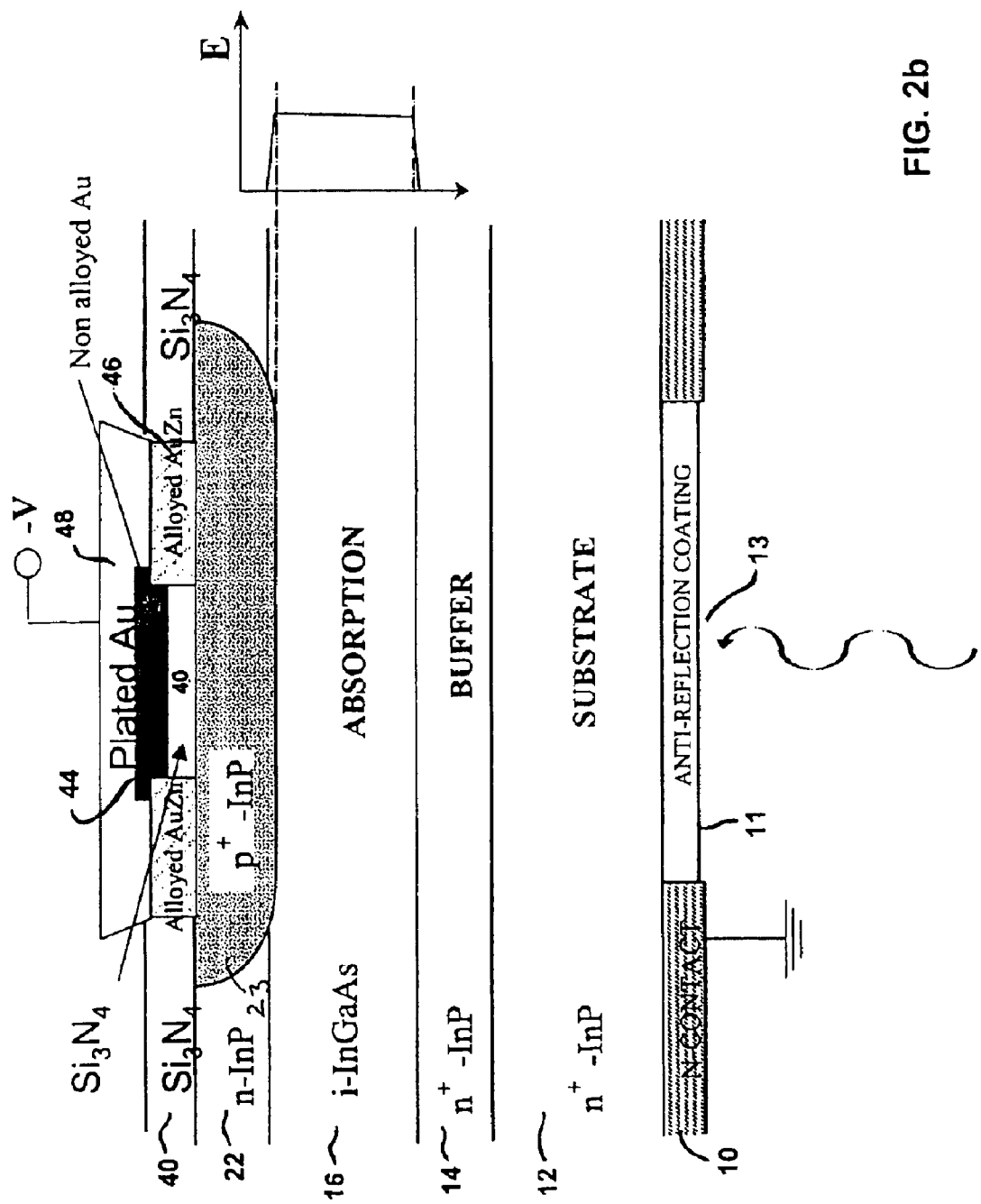
FIG. 2b is a drawing illustrating a layer structure of a PIN in accordance with an embodiment of this invention.

A similar contact and reflector structure in accordance with the present invention is shown in FIG. 2b for a PIN PD. A light transmissive window 40 of $Si_xN_y$, covered by a high reflectivity, such as gold 44 titanium 42, reflector within an AuZn alloyed electrode ring 46. The electrode ring 46 both supports the highly reflecting mirror and contains the layer of light transmissive $Si_xN_y$. The passivation layer of $Si_xN_y$ prevents alloy mixing from occurring between the reflector material and the epitaxial layer. An upper surface layer 48 of gold provides a larger electrical contact region for a P-contact which simplifies subsequent wire bonding steps.

In operation light input into port 13 is transmitted through transmissive semiconductor layers 12 and 14 to the absorption layer 16, where light is absorbed and electron/hole pairs are formed. Some light however is not absorbed and passes through second transmissive semiconductor layers, including the capping layer 22/23. This light passes through the $Si_xN_y$ window 40 and is reflected by the reflector 44 to make a return path through the second transmissive semiconductor layers to the absorption layer 16.

Figure 2C:
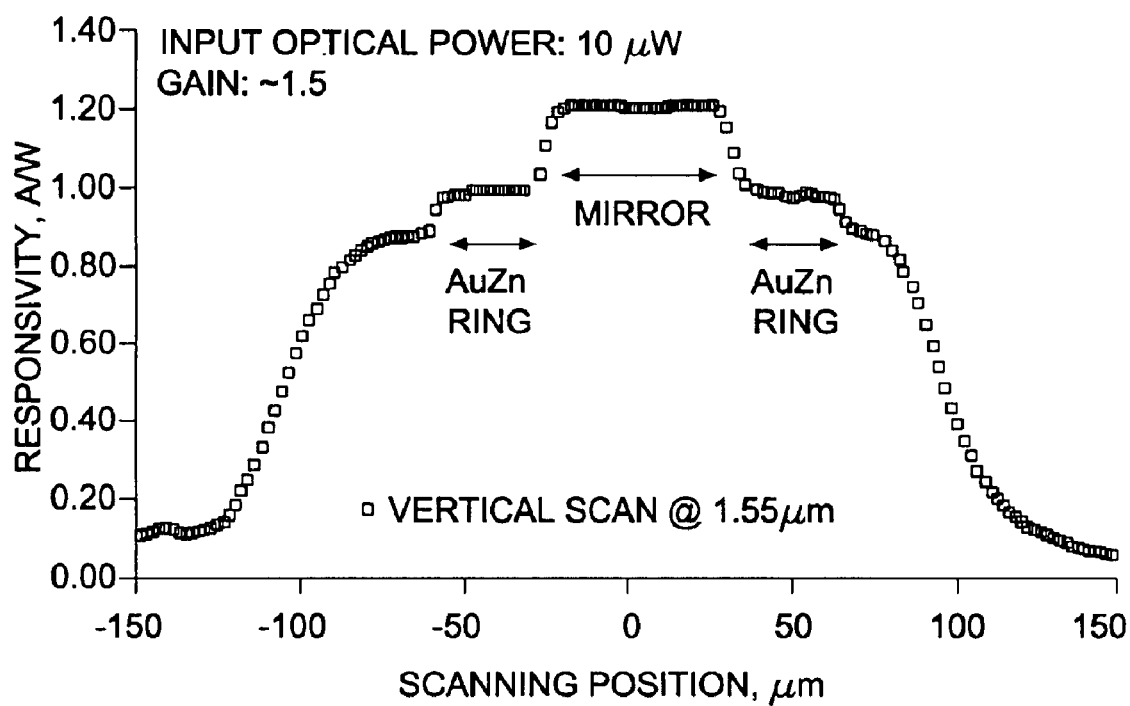
FIG. 2c is a graph depicting a two-dimensional surface scan on a test device in accordance with this invention, having a highly reflective metallic mirror in the center of an alloyed AuZn electrical contact ring.

APD test structures have been fabricated to verify the inventive concept. Based on this and a comparison of earlier measurements, the reflectivity of alloyed AuZn contacts is typically about 45%. In contrast, the mirror region of the contact in the present invention has a reflectivity of about 95%. The measurements show a 20% increase (at λ=1.55 μm) in responsivity from the mirror region in comparison to the alloyed contact region, as seen in FIG. 2c, a two-dimensional surface scan on a test device with a highly reflective metallic mirror in the center of an alloyed AuZn ring contact, which shows the responsivity versus position on the test structure. The change in reflectivity is evident between the mirror region and the AuZn ring contact. Corresponding responsivities are 1.2 A/W (mirror region) and 1.0 A/W (AuZn ring). Processed avalanche photodiodes show an equivalent level of responsivity improvement.

What is claimed is:

1. A photodetector comprising:

an input port at an input end face for receiving light to be detected, the input port being disposed about semiconductor layers including an absorption layer for absorbing light to be detected sandwiched between first and second light transmissive epitaxial semiconductor layers, the second light transmissive eptaxial semiconductor layer being a capping layer;

a passivation layer supported by only a portion of a surface of the second light transmissive epitaxial semiconductor capping layer, said passivation layer having an opening within for accommodating a ring of a first contact layer of alloyed material that is supported by a another portion of the surface of the second light transmissive semiconductor capping layer and at least partially alloyed therewith for providing electrical contact to the epitaxial semiconductor layers via the second light transmissive semiconductor capping layer; and, a highly reflective non-epitaxial III-V semiconductor, non-alloyed material supported in part by the first contact layer of alloyed material and supported in part by the passivation layer, said highly reflective non-epitaxial-III-V-semiconductor, non-alloyed material facing the epitaxial semiconductor layers for reflecting back light that propagated through the absorption layer for a second pass into the absorption layer; wherein a primary electrical conduction path is formed between the first contact layer of alloyed material and the epitaxial semiconductor absorption layer.

2. A photodetector as defined in claim 1 wherein the highly reflective non-epitaxial-III-V semiconductor, non-alloyed material further includes a layer of Ti to promote adhesion to adjacent surfaces to which bonding occurs.

3. A photodetector as defined in claim 1 wherein the first contact layer is a ring of material having inner walls which confine a portion of the passivation layer within the ring.

4. A photodetector as defined in claim 1 further comprising a substantially uniform highly conductive contact layer substantially covering the highly reflective non-III-V epitaxial-semiconductor, non-alloyed material and the first contact layer of alloyed material.

5. A photodetector as defined in claim 4, wherein the uniform highly conductive contacting layer is gold.

6. A photodetector as defined in claim 1 wherein the highly reflective, non-III-V-epitaxial-semiconductor and non-alloyed material is gold.

7. A structure within a photodiode comprising:

a semiconductor absorptive active layer for receiving and absorbing input light;

a light transmissive passivating layer forming a window over the semiconductor absorptive active layer within a contact structure, the contact structure comprising:

an electrically conductive alloyed material which forms a principal electrically conducting path to the semiconductor active layer from a contact region, said alloyed material having an opening therein surrounding the light transmissive passivating layer;

a reflector of highly reflective non-epitaxial-III-V, non-alloyed other material provided over the window and partially supported by an upper surface of the alloyed material about the window; and a layer of metal covering at least a portion of the highly reflective other material to promote adhension between the said material and at least the passivating layer forming the window.

8. A photodiode structure as defined in claim 7, wherein the layer of metal is a thin layer of titanium.

9. A structure within a photodiode comprising:

a semiconductor absorptive active layer for receiving and absorbing input light;

a light transmissive passivating layer forming a window over the semiconductor absorptive active layer within a contact structure, the contact structure comprising:

an electrically conductive alloyed material which forms a principal electrically conducting path to the semiconductor active layer from a contact region, said alloyed material having an opening therein surrounding the light transmissive passivating layer;

a reflector of highly reflective non-epitaxial-III-V, non-alloyed other material provided over the window and partially supported by an upper surface of the alloyed material about the window; and a first layer and a second layer of light transmissive semiconductor material sandwiching the semiconductor absorptive active layer.

10. A photodiode structure as defined in claim 9, wherein the second layer of semiconductor material is electrically conducting and contacts the alloyed material and the passivating layer.

11. A photodiode as defined in claim 10, wherein the alloyed material is a ring-like structure.

12. A photodiode as defined in claim 11, wherein the passivating layer is contained within an opening in the ring-like structure.

13. A photodiode as defined in claim 10, wherein the passivating layer is bounded by and contacting the alloyed material, the second layer of semiconductor material, and an adhesion layer coating the highly reflective non-epitaxial-III-V, non-alloyed other material.

14. A photodiode as defined in claim 13, further comprising a layer of highly conducting material disposed over and contacting both the alloyed material and the highly reflective non-III-V, non-alloyed other material.

15. A photodiode as defined in claim 14, wherein the layer of highly conducting material is gold.

* * * * *